(12) United States Patent
Chen

(10) Patent No.: US 7,284,185 B2
(45) Date of Patent: Oct. 16, 2007

(54) PUNCTURING/DEPUNCTURING USING COMPRESSED DIFFERENTIAL PUNCTURING PATTERN

(75) Inventor: Dayong Chen, Cary, NC (US)

(73) Assignee: Telefonaktiebolaget LM Ericsson (publ) (SE)

( * ) Notice: Subject to any disclaimer, the term of this patent is extended or adjusted under 35 U.S.C. 154(b) by 610 days.

(21) Appl. No.: 10/961,546

(22) Filed: Oct. 8, 2004

(65) Prior Publication Data

US 2006/0090120 A1    Apr. 27, 2006

(51) Int. Cl.
*H03M 13/03* (2006.01)
(52) U.S. Cl. .................................................. 714/790
(58) Field of Classification Search .................. 714/790
See application file for complete search history.

(56) References Cited

U.S. PATENT DOCUMENTS

| 4,890,326 A | 12/1989 | Euler .......................... 701/229 |
| 5,386,211 A | 1/1995 | Goveas et al. |
| 5,548,688 A | 8/1996 | Wiklof et al. ................. 358/1.8 |
| 6,370,669 B1 | 4/2002 | Eroz et al. |
| 6,604,216 B1 | 8/2003 | Jäverbring et al. |
| 7,076,726 B1 * | 7/2006 | Yun et al. .................... 714/790 |
| 7,095,808 B1 * | 8/2006 | Shohara ....................... 375/340 |
| 2003/0088822 A1 | 5/2003 | Kim et al. |

FOREIGN PATENT DOCUMENTS

| EP | 605892 | 7/1994 |
| JP | 2/006766 | 1/1990 |
| JP | 3/002579 | 1/1991 |
| JP | 5/036213 | 2/1993 |

* cited by examiner

*Primary Examiner*—Shelly Chase
(74) *Attorney, Agent, or Firm*—Coats & Bennett, P.L.L.C.

(57) ABSTRACT

Differential puncture patterns are used for puncturing and de-puncturing codewords transmitted over a communication channel. The puncture pattern comprises a series of successive differential indices or offsets corresponding to differences between successive bit indices in an absolute bit index sequence. The differential puncture patterns are used at the transmitter to select bits of a codeword for transmission over the communication channel. At the receiver, the differential puncture pattern is used to determine the bit positions of received bits in a de-punctured codeword.

38 Claims, 8 Drawing Sheets

PUNCTURING/DEPUNCTURING USING COMPRESSED DIFFERENTIAL PUNCTURING PATTERN

BACKGROUND OF THE INVENTION

The present invention relates generally to puncture patterns for forward error correcting codes and, more particularly, to a method of puncturing and de-puncturing convolutional codes using a compressed differential puncturing pattern.

The ultimate purpose of a digital communication system is to transmit information from an information source to a destination over a communication channel. In many types of communication channels, such as radio channels, the inherent noise causes bit errors to occur during transmission. In order to reduce bit errors, digital communication systems typically employ both error detecting and error correcting codes. These error control codes introduce controlled redundancy into the information transmitted over the communication channel, which can be used at the destination to detect and/or correct errors in the received signal.

Convolutional codes are one type of forward error correcting codes used in digital communication systems. The code rate k/n of a convolutional code indicates the number of output bits n produced by the encoder for each k input bits. In general, the complexity of the encoder and decoder increases as the number of input bits k increases. Consequently, convolutional encoders with code rates 1/n are desirable from a complexity point of view. However, if k is constrained to "1," the highest code rate that can be obtained is 1/2.

Puncturing is a technique of constructing new higher rate convolutional codes from an original lower rate convolutional code. For a given low rate convolutional code, it is possible to obtain a plurality of higher rate codes by selectively puncturing coded bits output from the encoder. The punctured bits are not transmitted. The higher rate convolutional codes created by puncturing can be decoded using essentially the same trellis as the original code from which the punctured code is derived. Further, a single encoder/decoder can be used to provide a range of code rates so that the code rate use can be varied, depending upon channel conditions and other factors.

To implement puncturing, a puncture pattern is stored in memory and used to puncture coded bits output by the encoder. One technique used in the prior art is to store an index for each bit to be transmitted. The index is a numerical value that identifies the bit position for each transmitted bit. Depending upon the length of the codeword to be transmitted, this technique requires a very significant amount of storage for the puncturing patterns. For example, an adaptive full rate 8-PSK wideband speech frame contains 1,467 bits after coding but before puncturing. According to the GSM specifications, 1,344 bits of the original 1,467 coded bits are transmitted. Storing a 16-bit index for each transmitted bit would require storage of 21,504 bits.

Another technique for storing puncturing patterns is to store a bit map containing 1 bit for each coded bit output from the encoder. Each bit in the bit map corresponds to a single coded output bit. A bit value of "0" in the bit map indicates that the corresponding bit output by the encoder is punctured, while a bit value of "1" indicates that the corresponding bit is to be transmitted, or vice versa. While this technique reduces the memory requirements for storing puncturing patterns, the processor must compare every coded bit output by the encoder with the bit map to see whether the bit is to be transmitted or punctured. The code needed to perform these comparisons consumes processor cycles increasing the demand on the signal processor. Because some cellular communication systems may use more than 100 logical channels with different puncturing patterns, there is a need for techniques that further reduce the memory requirements for storing the puncturing patterns and that reduce of processor cycles needed for carrying out puncturing/depuncturing operations.

SUMMARY OF THE INVENTION

The present invention is a channel coder/decoder that performs puncturing/depuncturing of forward error correcting codes. The channel coder/decoder uses differential puncture patterns that can be compressed and stored in memory. The differential puncture patterns result in relatively low complexity puncturing and depuncturing algorithms that conserve processing power.

The differential puncture patterns are derived from an absolute bit index sequence that indicates the bits of a codeword transmitted over a communication channel from a transmitter to a receiver. At the transmitter, the differential puncture pattern is used to select the bits of the codeword to be transmitted. At the receiver, the differential puncture pattern is used to insert the received bits into the correct bit positions in a depunctured codeword. The differential puncture pattern comprises a sequence of successive differential indexes or offsets corresponding to the differences between successive bit indexes in the bit index sequence. The differential puncture pattern can be compressed to reduce memory requirements for storage of the differential puncture pattern. To compress the differential puncture patterns, repeating sub-patterns in the differential puncture pattern are identified and stored along with the number of sub-patterns, the length of the sub-patterns, the number of repetitions of the sub-pattern, and the starting index.

DETAILED DESCRIPTION OF THE INVENTION

Figure 1:
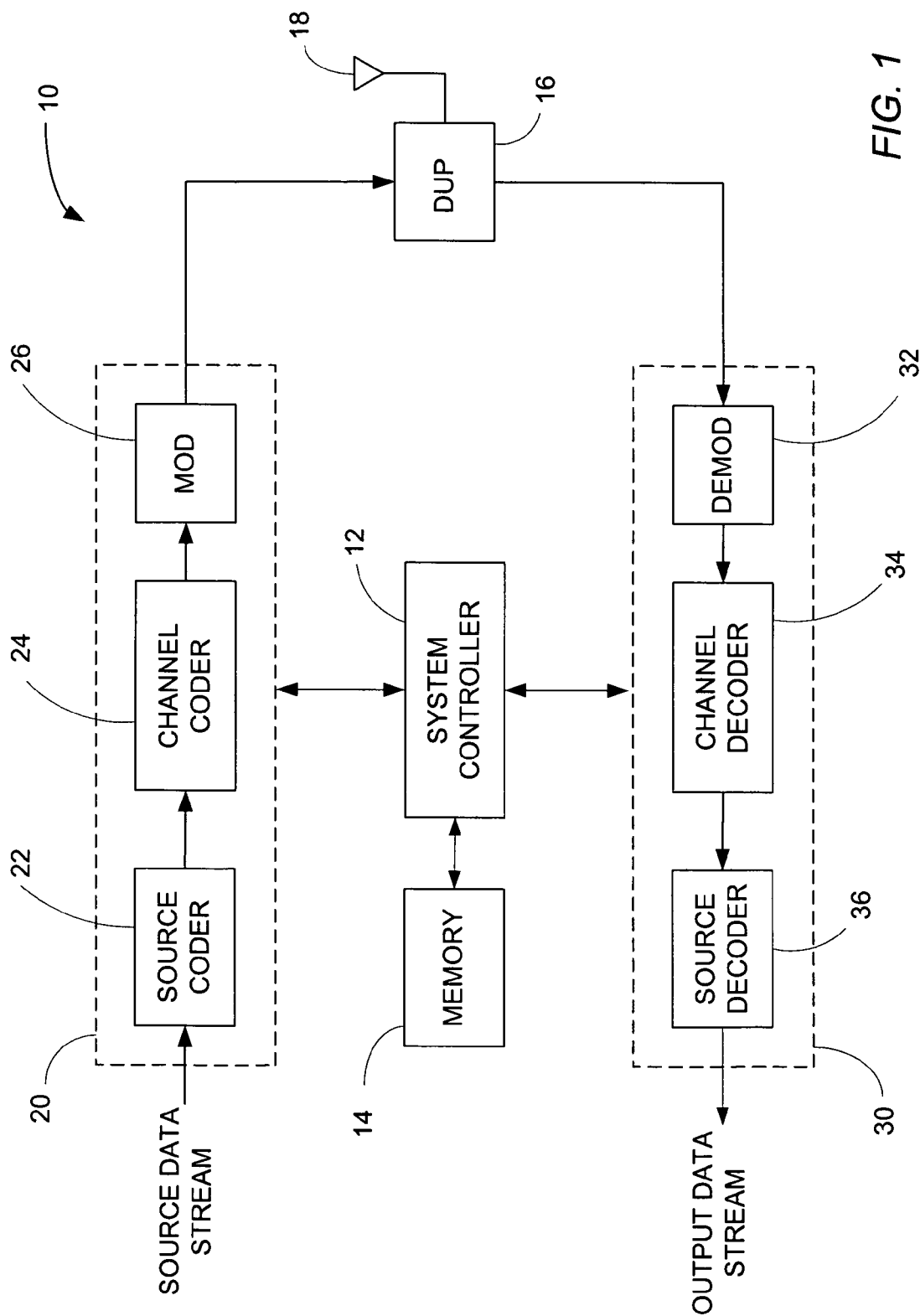
FIG. 1 is a block diagram of a mobile communication device in which the channel coder/decoder of the present invention could be used.

FIG. 1 illustrates a mobile communication device generally indicated by the numeral 10. The mobile communication device 10 comprises a system controller 12 to control the overall operation of the mobile communication device 10, a memory 14 to store programs and data needed for operation, a transmitter 20 to transmit signals, and a receiver 30 to receive signals. The transmitter 20 and receiver 30 are coupled to a common antenna 18 by a duplexer 16 that permits full duplex operation.

The transmitter 20 receives a source data stream from an information source, processes the source data stream to generate a transmit signal suitable for transmission over a radio channel, and modulates the transmit signal onto an RF carrier. The transmitter 20 includes a source encoder 22, a channel coder 24 and a modulator 26. The source encoder 22 removes redundancy or randomizes the source data stream to produce an information sequence that has been optimized for maximum information content. The information sequence from the source encoder 22 is passed to the channel coder 24. The channel encoder 24 introduces an element of redundancy into the information sequence supplied by the source encoder 22 to generate a coded output. The redundancy added by the channel coder 24 serves to enhance the error correction capability of the communication system. By making use of the redundant information, a receiver 30 can detect and correct bit errors that may occur during transmission. The output of the channel coder 24 is the transmit bit sequence. The modulator 26 receives the transmit bit sequence from the channel coder 24 and generates waveforms that both suit the physical nature of the communication channel and can be efficiently transmitted over the communication channel. Typical modulation schemes used in mobile communication devices 10 include 16QAM, 8-PSK, 4-PSK, and the like.

The receiver 30 receives signals transmitted from a far-end device that has been corrupted by passage through the communication channel. The function of the receiver is to reconstruct the original source data stream from the received signal. The receiver 30 includes a demodulator 32, channel decoder 34, and source decoder 36. The demodulator 32 processes the received signal and generates a received bit sequence, which may comprise hard or soft values for each received bit. If the received signal is transmitted without error through the communication channel, the received bit sequence would be identical to the transmit bit sequence at the transmitter. In actual practice, the passage of the received signal through the communication channel introduces bit errors into the received signal. The channel decoder 34 uses the redundancy added by the channel coder 24 at the transmitter 20 to detect and correct the bit errors. A measure of how well the demodulator 32 and decoder 34 perform is the frequency with which bit errors occur in the decoded sequence. As a final step, a source decoder 36 reconstructs the original signal from the information source. The difference between the reconstructed information signal and the original information signal is a measure of the distortion introduced by the communication system.

Figure 2:
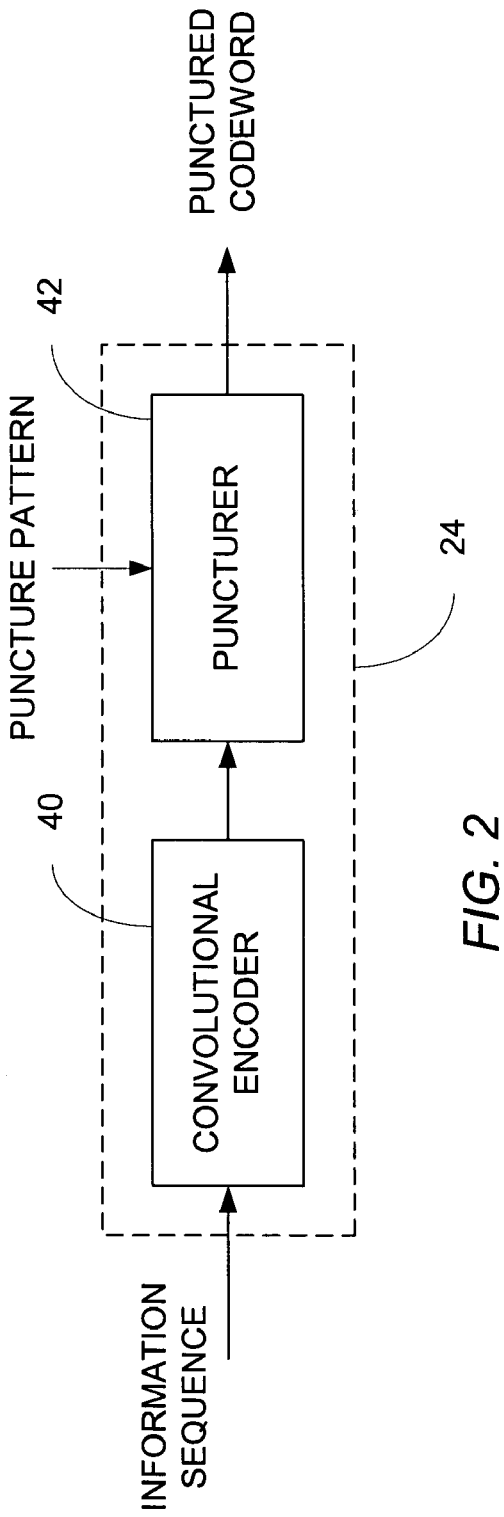
FIG. 2 is a block diagram of an exemplary channel coder according to the present invention.
Figure 3:
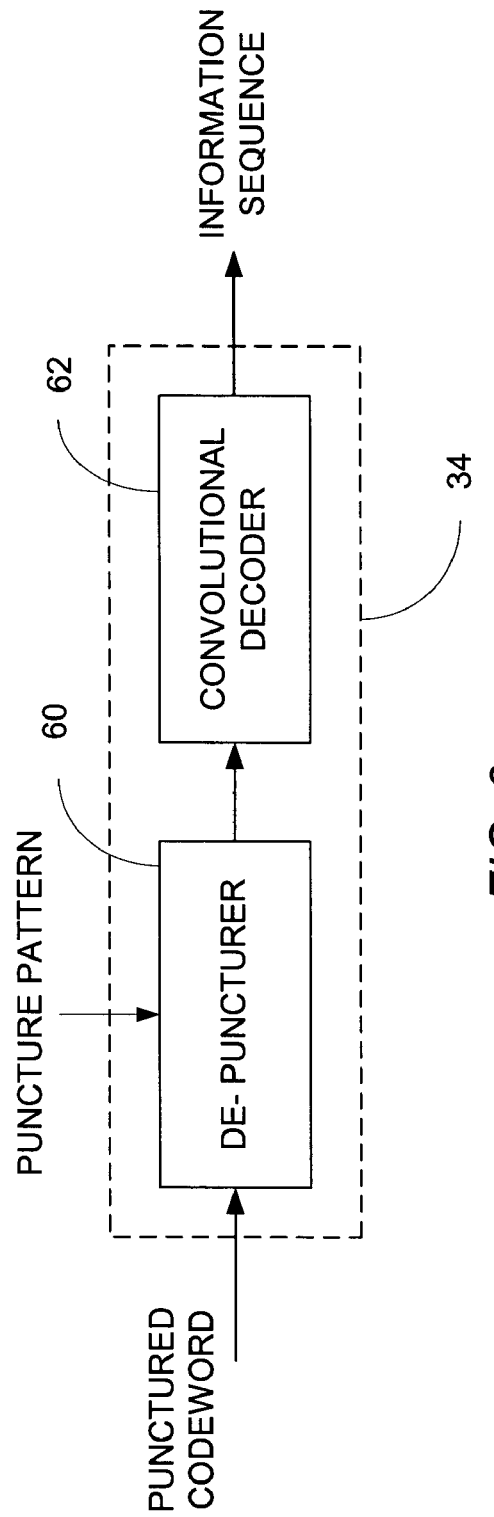
FIG. 3 is a block diagram of an exemplary channel decoder according to the present invention.

FIGS. 2 and 3 illustrate an exemplary channel coder 24 and decoder 34, respectively. The channel coder 24 (FIG. 2) includes an encoder 40 to encode an information sequence from the source encoder 22 and a puncturer 42 to puncture coded bits output by the encoder 40. The encoder 40 may, for example, comprise a 1/2 rate convolutional encoder that produces two coded bits for each input bit. The code bits output by the encoder 40 form a codeword that is input to the puncturer 42. The puncturer 42 selects the coded bits to be transmitted based on a puncture pattern stored in memory 14.

The channel decoder 34 (FIG. 3) comprises a de-puncturer 60 followed by a decoder 62. The de-puncturer 60 determines the correct bit positions for the received bits and outputs a de-punctured codeword to the decoder 62. As explained in more detail below, the de-punctured codeword is not the same as the original codeword because the punctured bits are replaced with neutral values in the de-punctured codeword. The neutral values may be "0s" if the received bits are represented by +/−1, or soft values symmetrically distributed around "0." The decoder 62 may comprises a MLSE decoder (i.e., Viterbi decoder), a MAP decoder, or any other known type of decoder.

According to the present invention, the puncture pattern is compressed to reduce storage requirements and decompressed to perform puncturing and de-puncturing. The compression technique generates a differential puncture pattern that is used to directly select the bits for transmission at the transmitter 20, and to determine the correct bit positions of the received bits in a de-punctured codeword at the receiver 30. At the transmitter 20, the puncturer 42 directly selects bits to be transmitted without performing operations on the punctured bits. The direct selection of the transmitted bits significantly reduces the number of instructions that must be executed by the puncturer 42. At the receiver 30, the de-puncturer 60 determines the bit positions of the received bits in a de-punctured codeword and inserts the received bits in the determined positions.

The channel coding/decoding method employed in the present invention is described below using the wideband full rate speech channel (O-TCH/WFS23.85) as an example. The desired channel coding for this channel is described in the GSM specification 45.003, Release 5. According to the GSM specification, the codeword output by the encoder 40 has 1,467 bits before puncturing. The codeword is divided into two blocks called the Pg block and the Pb block. The Pg block comprises 896 of the original 1,467 bits. The Pb block comprises 448 bits of the original 1,467 bits. A total of 1344 bits are transmitted in the Pg and Pb blocks so 146 bits are punctured. The bits of the Pg block are given by the bit index sequence:

2, 3, 5, 6, 8, 9, 11, 12, 14, 15, 17, 18, 20 . . . 1343, 1346, 1347, 1349, 1350, 1352, 1353, 1355, 1358, 1359, 1361, 1362, 1364, 1365, 1367 . . .

Each bit index in the index sequence corresponds to one transmitted bit. A bit index value of "2" for example, indicates that the second bit in the original codeword is transmitted. The bit index sequence is an absolute puncture pattern since it consists of absolute bit indexes for each transmitted bit.

According to the present invention, a differential puncture pattern is computed based on the bit index sequence and then compressed to reduce memory requirements. The differential puncture pattern is computed by calculating the differences between successive bit indexes in the original bit index sequence. For the bit index sequence given above, the corresponding differential puncture pattern is:

1, 2, 1, 2, 1, 2 . . . 3, 1, 2, 1, 2, 1, 2, 3, 1, 2, 1, 2, 1, 2 . . .

Each element of the differential puncture pattern is a differential index or offset that functions as a relative bit index. The offset represents the difference between the absolute indices of two consecutive transmitted bits. The differential puncture pattern is referenced to a starting index that indicates the bit position of the first transmitted bit in the codeword. In the example given above, the starting index is "2." With knowledge of the starting index and the differential puncture pattern, the absolute bit index for each transmitted bit in a codeword can be determined.

Due to the strong regularity of the puncture pattern for the Pg block, the entire differential puncture pattern for the Pg block can be represented by three differential sub-patterns:

P1=[1, 2] repeated 171 times,
P2=[3, 1, 2, 1, 2, 1, 2] repeated 78 times, and
P3=[3, 1, 2, 1, 2, 3, 3] repeated once.

After computing the differential puncture pattern, the differential puncture pattern can be compressed by identifying the sub-patterns. A compressed version of the differential puncture pattern can be created by storing the following information:

a0 the absolute bit index value of the first code bit to be transmitted

SN number of sub-patterns in the differential puncture pattern rep[] array containing number of repetitions for each sub-pattern len[] array containing the length of each sub-pattern pat[] array containing sub-patterns The compressed differential puncture pattern requires 37 16-bit words to store in memory 14. For comparison, storing the bitmap would require 184 16-bit words. Given that some mobile communication devices 10 may use more than 100 puncture patterns, the present invention substantially reduces the memory 14 required to store the puncture patterns.

Figure 4:
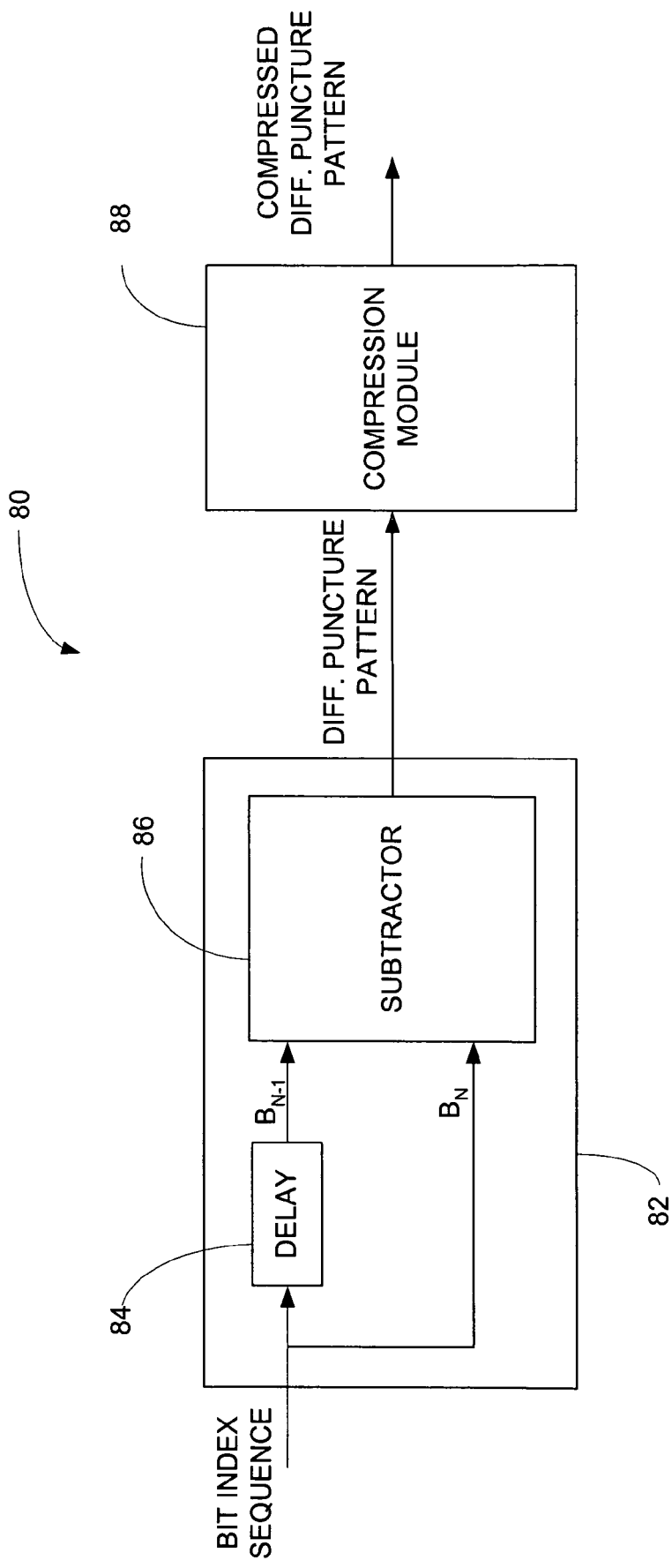
FIG. 4 is a block diagram of an apparatus for generating compressed differential puncture patterns according to one embodiment of the present invention.

FIG. 4 illustrates an exemplary apparatus according to one embodiment of the invention, indicated generally at 80, for generating compressed differential puncture patterns. The apparatus illustrated in FIG. 4 may be implemented by software stored in a computer readable media and executed by a processor. The apparatus 80 comprises a pattern generator 82 and a compression module 88. The pattern generator 82 includes a delay element 84 and a subtractor 86. An absolute bit index sequence indicating the absolute bit indices for transmitted bits in a codeword is input to the pattern generator 82 one bit index at a time. Delay element 84 introduces a one element delay in the bit index sequence. Subtractor 86 subtracts the previous bit index ($b_{n-1}$) at time n−1 from the current bit index ($b_n$) to compute a differential index or offset. The sequence of differential indices or offsets output from the subtractor 86 comprises the differential puncture pattern. The differential puncture pattern is input to the compression module 88, which compresses the differential puncture pattern.

Figure 5:
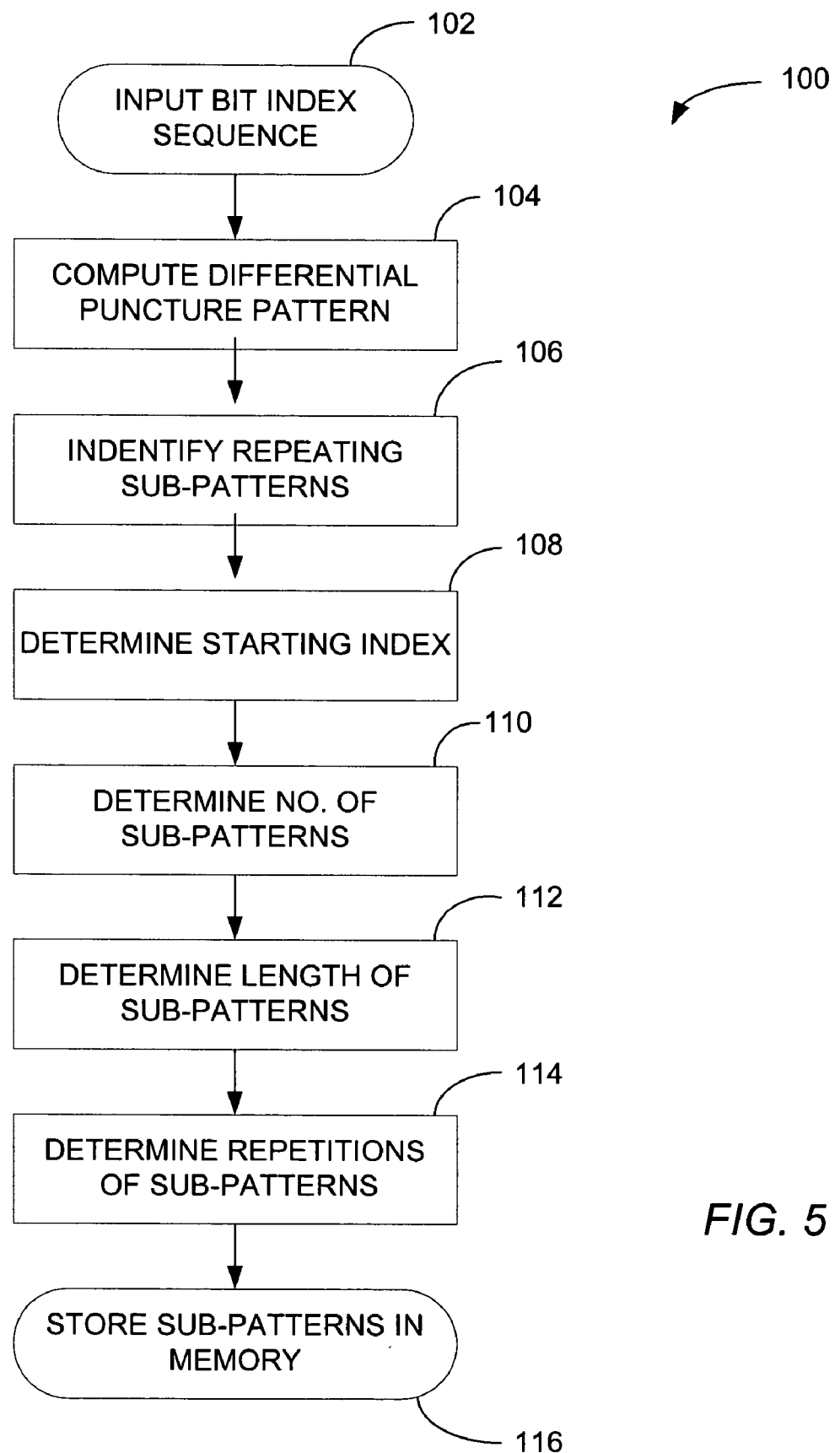
FIG. 5 is a flow chart illustrating a method of generating compressed differential puncture patterns according to one embodiment of the present invention.

FIG. 5 is a flow diagram illustrating a method of generating compressed differential puncture patterns according to some embodiments of the invention indicated generally at 100. To begin generation of a compressed differential puncture pattern, the absolute bit index sequence for the puncture pattern is input to the pattern generator 82 (block 102). The pattern generator 82 computes the differential puncture pattern (block 104) as previously described. The compression module 88 then processes the differential puncture pattern to identify repeating sub-patterns (block 106). The compression module 88 determines the starting index for the differential puncture pattern (block 108), the number of sub-patterns (block 110), the length of the sub-patterns (block 112), and the number of repetitions of each sub-pattern (block 114). The compressed differential puncture pattern is then stored in memory 14 (block 116).

The compressed differential puncture pattern of the present invention not only conserves memory, but also lends itself to efficient puncturing and de-puncturing techniques that significantly reduce the number of instructions or operations that must be executed. For puncturing, the differential puncture pattern is decompressed and the decompressed differential puncture pattern is used to sequentially select coded bits for transmission. For de-puncturing, the differential puncture pattern is used to insert the received bits in the correct positions in a de-punctured codeword.

Figure 6:
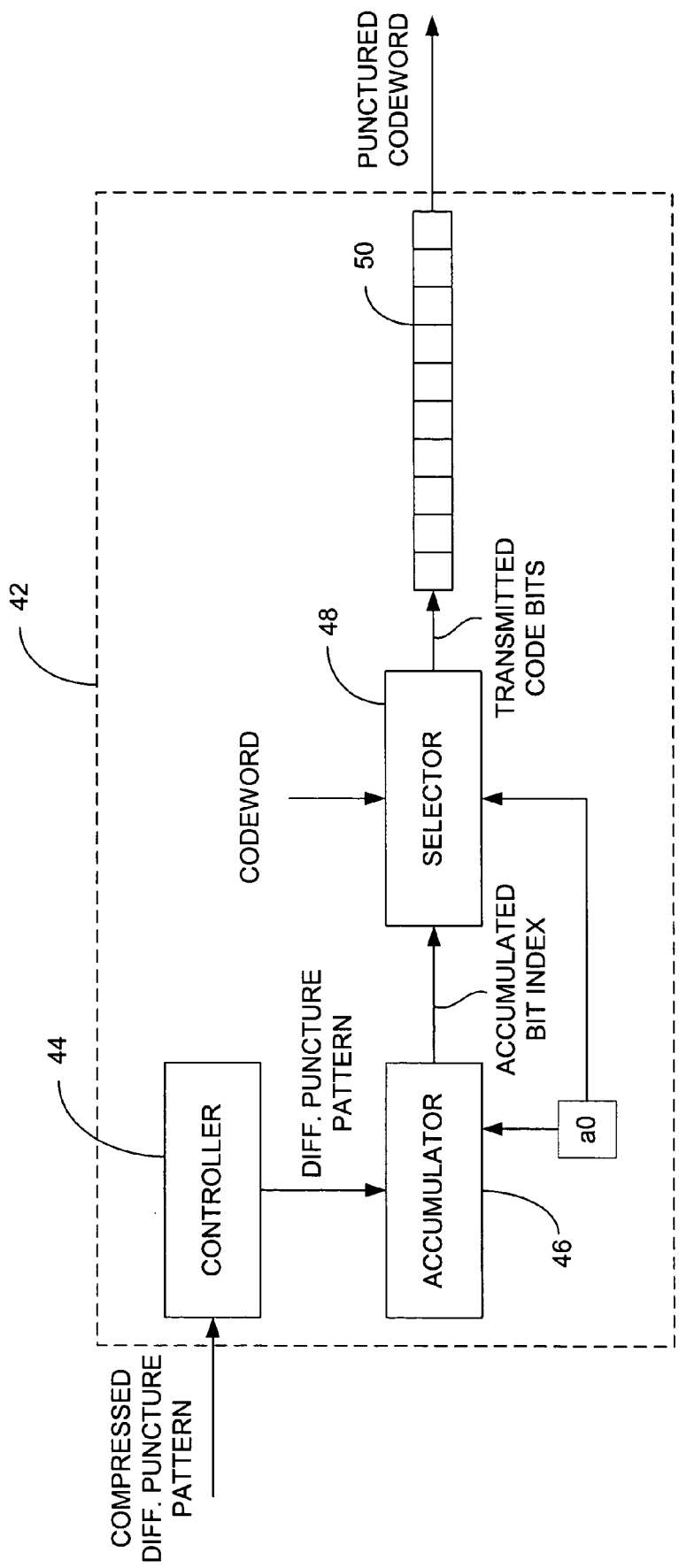
FIG. 6 is a block diagram of an exemplary puncturer for a channel decoder according to one embodiment of the present invention.

FIG. 6 illustrates an exemplary puncturer 42 in block diagram form. The puncturer 42 may be implemented in hardware, firmware, software or a combination thereof. In one exemplary embodiment, the puncturer 42 is implemented by software stored in a computer readable media and executed by a processor. As shown in FIG. 6, the puncturer 42 includes a controller 44, an accumulator 46, a selector 48 and an output buffer 50. The absolute bit index, a0, for the first output bit is used to initialize the accumulator 46. The absolute bit index is also supplied to the selector 48, which selects the first coded bit to be transmitted and writes it to the first position in the output buffer 50, which contains the transmit bit sequence. After the first coded bit is written to the output buffer 50, the differential puncture pattern is used to select the remaining coded bits to be transmitted. The differential indices or offsets of the differential puncture pattern are processed one at a time and used to select the coded bits to be transmitted (i.e., the transmit bits) using an accumulate and select technique. The differential indices or offsets are input to the accumulator 46, which maintains an accumulated bit index. The offset is added to the accumulated bit index to get a new accumulated bit index and the new accumulated bit index is output to the selector 48. The selector 48 uses the accumulated bit index output by the accumulator 46 to select the coded bits for transmission. For example, if the accumulated bit index at time t is "64," the selector 48 selects the 64th coded bit and writes it to the next location in the output buffer. This process is repeated, selecting coded bits for transmission one at a time until the entire transmit bit sequence is complete.

Figure 7:
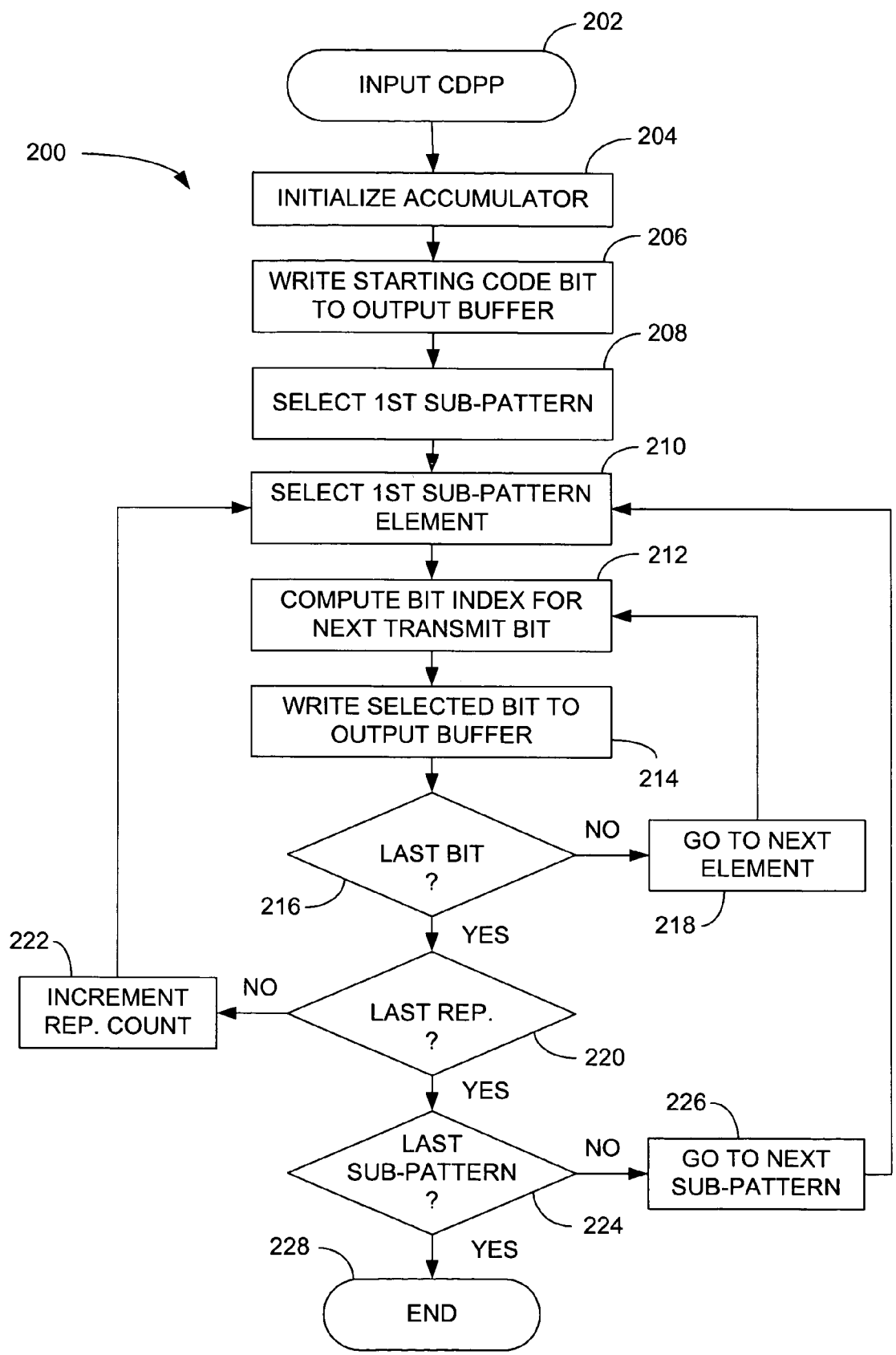
FIG. 7 is a flow chart of an exemplary puncturing method using differential puncture patterns according to one embodiment of the present invention.

FIG. 7 is a flow diagram illustrating the puncturing operation indicated generally at 200. To begin the puncturing operation, the controller 44 selects the appropriate compressed differential puncture pattern from memory 14 (block 202) and uses the absolute bit index for the first transmitted bit to initialize the accumulator 46 (block 204) and select the first output bit (block 206). After writing the first output bit to the output buffer 50, the controller 44 selects the first sub-pattern in the compressed differential puncture pattern (block 208) and then selects the first element of the first sub-pattern (block 210). Those skilled in the art will recognize that the sub-pattern elements are the differential indices or offsets that comprise the differential puncture pattern. The controller 44 sequentially inputs the sub-pattern elements to the accumulator 46, which calculates the accumulated bit index (block 212). The selector 48 uses the accumulated bit index output by the accumulator 46 to select the next coded bit for transmission (block 214). After each element in the differential puncture pattern is processed, the controller 44 determines if it was the last element in the sub-pattern (block 216). If not the controller 44 selects the next sub-pattern element (block 218) and repeats the accumulate and select process (block 212, 214). When the last element in a sub-pattern is reached, the controller 44 determines whether to repeat processing of the sub-pattern (block 220). If the desired number of repetitions has not been performed, the controller 44 increments the repetition count (block 222) and iteratively processes the sub-pattern until the last repetition is complete (blocks 210-218). When the last repetition of a sub-pattern is complete, the controller 44 determines if all the sub-patterns have been processed (block 224). If not, the controller 44 selects the next sub-pattern (block 226) for processing as previously described (blocks 210-222). Processing of the differential puncture pattern ends (block 228) when the last sub-pattern is processed.

Figure 8:
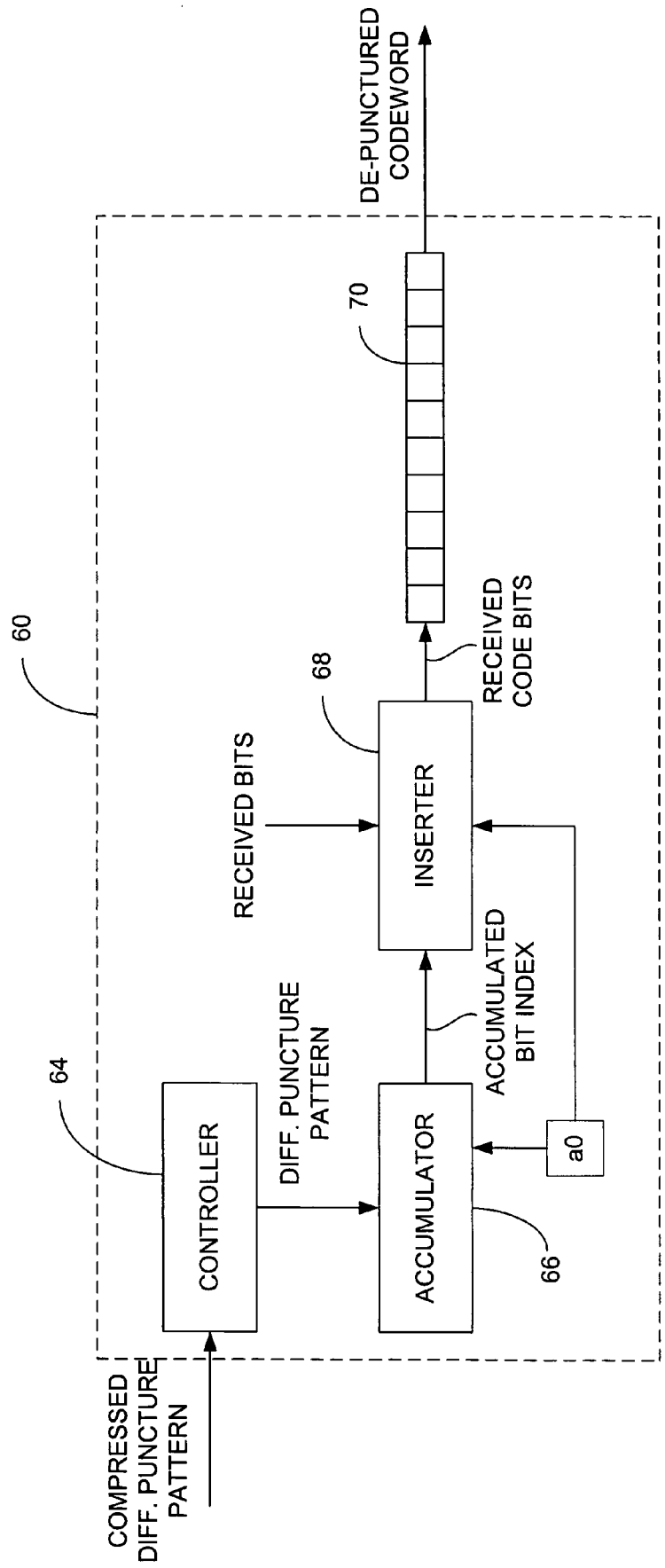
FIG. 8 is a block diagram of an exemplary de-puncturer for a channel decoder according to one embodiment of the present invention

FIG. 8 illustrates a de-puncturer 60 in block diagram form according to some embodiments of the invention. The de-puncturer 60 may be implemented in hardware, firmware, software or a combination thereof. In one exemplary embodiment, the de-puncturer 60 is implemented by software stored in a computer readable media and executed by a processor. As shown in FIG. 8, the de-puncturer 60 includes a controller 64, accumulator 66, an inserter 68 and an output buffer 70. The length of the output buffer 70 is the same as the length of the original codeword before puncturing. The elements of the output buffer 70 are initialized with neutral values, such as "0" if the received bits have values of +/−1, or soft values distributed around "0." The absolute bit index, a0, for the first output bit is used to initialize the accumulator 66. The absolute bit index is also supplied to the inserter 68, which inserts the first received bit into the output buffer 70 at the bit position indicated by the starting index. For, example, if the starting index is "2," the inserter 68 inserts the first received bit into the second bit position in the output buffer 70. After the first received bit is written to the output buffer 70, the differential indices or offsets of the differential puncture pattern are processed one at a time and used to insert the received bits into the output buffer 70. The differential indices or offsets comprising the differential puncture pattern are input to the accumulator 66, which maintains an accumulated bit index. Each offset is added to the accumulated bit index to get a new accumulated bit index and the new accumulated bit index is output to the inserter 68. The inserter 68 uses the accumulated bit index output by the accumulator 66 to determine the bit position in the output buffer for the next received bit. For example, if the accumulated bit index output at time t is "64," the inserter 68 inserts the next received bit into the 64th bit position in the output buffer 70. This process is repeated, inserting received bits one at a time into the output buffer 70 until the entire received bit sequence is processed. The contents of the output buffer 70 comprise a de-punctured codeword, corresponding to the original codeword before puncturing. The de-punctured codeword, however, is not identical to the original codeword because all of the punctured bits in the original codeword are replaced with neutral soft values.

Figure 9:
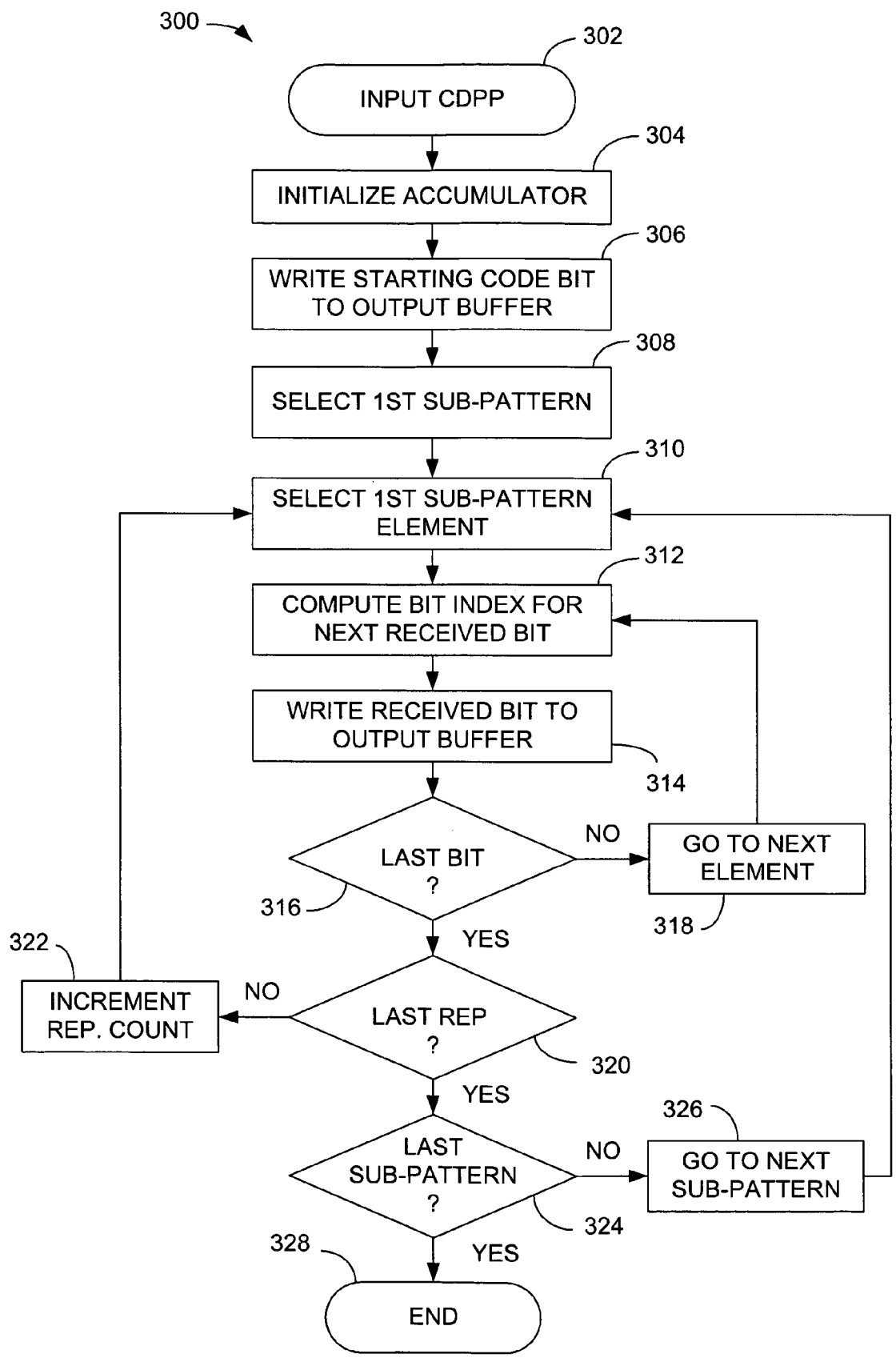
FIG. 9 is a flow chart of an exemplary de-puncturing method using differential puncture patterns according to one embodiment of the present invention.

FIG. 9 is a flow diagram illustrating the de-puncturing operation indicated generally by 300. To begin the de-puncturing operation, the controller 64 selects the appropriate compressed differential puncture pattern from memory 14 (block 302) and uses the absolute bit index for the first transmitted bit to initialize the accumulator 66 (block 304). The absolute bit index is also input to the inserter 68, which inserts the first received bit into the output buffer 70 at the bit position indicated by the absolute bit index (block 306). After writing the first received bit to the output buffer 70, the controller 64 selects the first sub-pattern in the compressed differential puncture pattern (block 308) and then selects the first element of the first sub-pattern (block 310). The controller 64 sequentially inputs the sub-pattern elements to the accumulator 66, which calculates the accumulated bit index (block 312). The inserter 68 uses the accumulated bit index output by the accumulator 66 to insert the next received bit into the output buffer 70 at the bit position indicated by the accumulated bit index (block 314). After each element in the differential puncture pattern is processed, the controller 64 determines if it was the last element in the sub-pattern (block 316). If not the controller 64 selects the next sub-pattern element (block 318) and repeats the accumulate and insert process (blocks 312, 314). When the last element in a sub-pattern is reached, the controller 64 determines whether to repeat processing of the sub-pattern (block 320). If the desired number of repetitions has not been performed, the controller 64 increments the repetition count (block 322) and processes the sub-pattern again (blocks 310-318). When the last repetition of a sub-pattern is complete, the controller 64 determines if all the sub-patterns have been processed (block 324). If not, the controller 64 selects the next sub-pattern (block 326) for processing as previously described (blocks 310-322). Processing of the differential puncture pattern ends (block 328) when the last sub-pattern is processed.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of generating a puncture pattern for puncturing and de-puncturing coded bit sequences, comprising:
    determining a differential puncture pattern referenced to a starting index based on a bit index sequence that identifies selected bits in a coded bit sequence, said differential puncture pattern comprising a plurality of successive offsets corresponding to differences between successive bit indices in the bit index sequence.

2. The method of claim 1 further comprising compressing the differential puncture pattern based on repeating sub-patterns in the differential puncture pattern.

3. The method of claim 2 wherein compressing the differential puncture pattern comprises:
    identifying the repeating sub-patterns in the differential puncture pattern;
    determining the length of each sub-pattern; and
    determining the number of repetitions of each sub-pattern.

4. The method of claim 3 further comprising storing the compressed differential puncture pattern in memory.

5. The method of claim 4 wherein storing the compressed differential puncture pattern in memory comprises storing in memory the starting index for the differential puncture pattern, the number of sub-patterns in the differential puncture pattern, the length of the sub-patterns, the number of repetitions of the sub-patterns, and the sub-patterns.

6. A method of channel coding and decoding comprising:
    obtaining a differential puncture pattern comprising a sequence of successive offsets corresponding to differences between successive bit indices in a bit index sequence that identifies bits to be transmitted; and
    puncturing or de-puncturing a codeword based on said differential puncture pattern.

7. The method of claim 6 wherein puncturing the codeword comprises selecting coded bits from an unpunctured codeword for transmission based on the differential puncture pattern.

8. The method of claim 7 wherein selecting coded bits from the unpunctured codeword comprises:
   iteratively accumulating said successive offsets in said differential puncture pattern to obtain an accumulated bit index during each iteration; and
   during each iteration, selecting a coded bit from the unpunctured codeword based on said accumulated bit index.

9. The method of claim 6 wherein de-puncturing the codeword comprises determining the bit positions of received bits of a punctured codeword in a de-punctured output sequence.

10. The method of claim 9 wherein determining the bit positions of the received bits in the de-punctured output sequence comprises:
   iteratively accumulating said successive offsets in said differential puncture pattern to obtain an accumulated bit index during each iteration; and
   during each iteration, determining the bit position of a received bit of the punctured codeword based on said accumulated bit index.

11. The method of claim 6 further comprising compressing the differential puncture pattern.

12. The method of claim 11 wherein compressing the differential puncture pattern comprises:
   identifying repeating sub-patterns in the differential puncture pattern;
   determining the length of each sub-pattern; and
   determining the number of repetitions of each sub-pattern.

13. The method of claim 12 further comprising storing the compressed differential puncture pattern in memory.

14. The method of claim 13 wherein storing the compressed differential puncture pattern in memory comprises storing in memory the starting index for the differential puncture pattern, the number of sub-patterns in the differential puncture pattern, the length of the sub-patterns, the number of repetitions of the sub-patterns, and the sub-patterns.

15. An apparatus for generating puncture patterns for puncturing and de-puncturing operations, comprising:
   a pattern generator to compute a differential puncture pattern referenced to a starting index based on a bit index sequence identifying selected bits in a coded bit sequence said differential puncture pattern comprising a sequence of successive offsets corresponding to the differences between successive bit indices in the bit index sequence.

16. The apparatus of claim 15 wherein the pattern generator comprises a processor.

17. The apparatus of claim 15 further comprising a pattern compressor to compress the differential puncture pattern based on repeating sub-patterns in the differential puncture pattern.

18. The apparatus of claim 17 wherein the pattern compressor compresses the differential puncture pattern by identifying the repeating sub-patterns in the differential puncture pattern, determining the length of each sub-pattern, and determining the number of repetitions of each sub-pattern.

19. The apparatus of claim 17 wherein the pattern generator and pattern compressor comprise a processor.

20. The apparatus of claim 17 further comprising a memory to store the compressed puncture pattern.

21. A channel coding/decoding apparatus comprising:
   memory to store a differential puncture pattern comprising a sequence of successive offsets corresponding to the differences between successive bit indices in a bit index sequence that identifies bits to be transmitted; and
   a channel coder/decoder to puncture or de-puncture a codeword based on the differential puncture pattern stored in memory.

22. The channel coding/decoding decoding apparatus of claim 21 wherein said channel coder/decoder generates a punctured codeword for transmission by selecting coded bits from an unpunctured codeword based on the differential puncture pattern.

23. The channel coding/decoding apparatus of claim 22 wherein the channel coder/decoder comprises:
   an accumulator to iteratively accumulate said successive offsets in said differential puncture pattern to obtain an accumulated bit index during each iteration; and
   a selector to select, during each iteration, a coded bit from the unpunctured codeword based on said accumulated bit index.

24. The channel coding/decoding apparatus of claim 23 wherein the channel coder/decoder further comprises a memory to store the differential puncture pattern.

25. The channel coding/decoding apparatus of claim 24 wherein the differential puncture pattern stored in the memory is a compressed differential puncture pattern.

26. The channel coding/decoding apparatus of claim 25 wherein the channel coder/decoder further comprises a controller to initialize the accumulator and to decompress the compressed differential puncture pattern.

27. The channel coding/decoding apparatus of claim 26 wherein the channel coder/decoder further comprises an output buffer coupled to the selector to store the punctured codeword.

28. The channel coding apparatus of claim 21 wherein the channel coder/decoder de-punctures a received punctured codeword by determining the bit positions of received bits of the punctured codeword in a de-punctured output sequence.

29. The channel coding apparatus of claim 28 wherein the channel coder/decoder comprises:
   an accumulator to iteratively accumulate said successive offsets in said differential puncture pattern to obtain an accumulated bit index during each iteration; and
   an inserter to insert, during each iteration, a received bit of the punctured codeword into a corresponding bit position in a de-punctured codeword based on said accumulated bit index.

30. The channel coding/decoding apparatus of claim 29 wherein the channel coder/decoder further comprises a memory to store the differential puncture pattern.

31. The channel coding/decoding apparatus of claim 30 wherein the differential puncture pattern stored in the memory is a compressed differential puncture pattern.

32. The channel coding/decoding apparatus of claim 31 wherein the channel coder/decoder further comprises a controller to initialize the accumulator and to decompress the compressed differential puncture pattern.

33. The channel coding/decoding apparatus of claim 32 wherein the channel coder/decoder further comprises an output buffer coupled to the selector to store the de-punctured codeword.

34. The channel coding/decoding apparatus of claim 33 wherein the controller initializes the output buffer with neutral values and wherein the inserter inserts the received bits into corresponding bit positions in the output buffer.

35. A computer readable media with an computer program stored thereon, said computer program comprising:
   code to determine a differential puncture pattern referenced to a starting index based on a bit index sequence that identifies selected bits in a coded bit sequence;

wherein said differential puncture pattern comprises a plurality of successive offsets corresponding to differences between successive bit indices in the bit index sequence.

36. The computer readable media of claim 35 wherein said computer program further comprises code to compress the differential puncture pattern based on repeating sub-patterns in the differential puncture pattern.

37. The computer readable media of claim 36 wherein the code to compress the differential puncture pattern comprises:
  code to identify repeating sub-patterns in the differential puncture pattern;
  code to determine the length of each sub-pattern; and
  code to determine the number of repetitions of each sub-pattern.

38. A computer readable media with an computer program stored thereon, said computer program comprising:
  code to obtain a differential puncture pattern comprising a sequence of successive offsets corresponding to differences between successive bit indices in a bit index sequence that identifies bits to be transmitted; and
  code to puncture or de-puncture a codeword based on said differential puncture pattern.

* * * * *